United States Patent [19]

Frank et al.

[11] Patent Number: 5,506,520
[45] Date of Patent: Apr. 9, 1996

[54] ENERGY CONSERVING CLOCK PULSE GENERATING CIRCUITS

[75] Inventors: David J. Frank; Paul M. Solomon, Yorktown Heights, N.Y.

[73] Assignee: International Business Machines Corporation, Armonk, N.Y.

[21] Appl. No.: 371,191

[22] Filed: Jan. 11, 1995

[51] Int. Cl.$^6$ .............................................. H03K 19/0948
[52] U.S. Cl. ............................. 326/96; 326/97; 327/99; 377/72; 377/76
[58] Field of Search ................................ 326/95, 96, 97, 326/93, 99; 327/296, 277, 278, 403, 407; 377/72, 76, 122, 124, 126

[56] References Cited

U.S. PATENT DOCUMENTS

| | | |
|---|---|---|
| 3,619,642 | 11/1971 | Dunn . |
| 3,622,809 | 11/1971 | Williams . |
| 4,441,198 | 4/1984 | Shibata et al. .............................. 377/78 |
| 4,542,301 | 9/1985 | Narabu ..................................... 377/76 |
| 4,567,386 | 1/1986 | Benschop . |
| 4,637,018 | 1/1987 | Flora et al. ................................ 327/96 |
| 4,680,539 | 7/1987 | Tsai ........................................ 377/72 |
| 4,741,003 | 4/1988 | Katanosaka . |
| 4,794,275 | 12/1988 | Traa ....................................... 377/124 |
| 4,825,109 | 4/1989 | Reynolds . |
| 4,999,526 | 3/1991 | Dudley .................................... 327/99 |
| 5,260,608 | 11/1993 | Marbot . |

OTHER PUBLICATIONS

An Electroid Switching Model For Reversible Computer Architectures. J. Storrs Hall, Oct. 2, 1992, Proc. Workshop on Physics and Computation, IEEE Comp. Soc. Press, 1993 p. 237.

Notes on The Histroy of Reversible Computation, C. H. Bennett, IBM Journal of Research and Development, vol. 32, No. 1; p. 16; Jan. 1988.

Primary Examiner—Edward P. Westin
Assistant Examiner—Benjamin D. Driscoll
Attorney, Agent, or Firm—Perman & Green

[57] ABSTRACT

An energy saving clock signal generator is disclosed including a source of multi-phase waveform signals, a shift register, and a matrix switch. The waveform source provide four, six or more waveform signals to the shift register and the matrix switch. A number of progressive pulses $N_{pp}$ which are an integer multiple of the number of waveform signals are applied from the shift register to the matrix switch. The matrix switch responds to the waveform signals and the progressive pulse signals to produce a number of output clock signals which may be used to drive adiabatic logic circuits.

14 Claims, 8 Drawing Sheets

ENERGY CONSERVING CLOCK PULSE GENERATING CIRCUITS

FIELD OF THE INVENTION

The present invention relates to clock circuits for generating timing pulses and more particularly to a shift register controlled clock circuit that is substantially dissipationless for energy conservation in an adiabatic switching logic system.

DESCRIPTION OF THE BACKGROUND ART

U.S. Pat. No. 4,441,198 issued Apr. 3, 1984 to Shibata et al. entitled SHIFT REGISTER CIRCUIT discloses a shift circuit wherein a series of latches provide a sequence of different pulses. More particularly, a first logic circuit comprises coupling gate circuits driven by clock pulses of different phases, flip-flop circuits cascade-connected via the coupling gate circuits and feedback circuits for feeding back the outputs of the flip-flop circuits to the preceding stage flip-flop circuits, and generates pulse sequences of different phases. A second logic circuit further comprises latch circuits one for each of the flip-flop circuits, driven by the pulse sequences generated by the first logic circuit. Those logic circuits are useful to a successive approximation register of a successive approximation A/D converter.

U.S. Pat. No. 4,741,003 issued Apr. 26, 1988 to Katanosaka entitled SHIFT REGISTER CIRCUIT discloses a technique for power reduction including a shift register circuit, having a plurality of stages capable of preserving data bits entered from an external source and shifting the data bits from stage to stage, each of the stages being driven by phase one, phase two and phase three clock signals, each signal alternating between a first and a second logic level. The shift register circuit comprises a first transistor responsive to the phase one clock signal for transferring a new data bit of either first or second logic level, a series combination of second, third, fourth and fifth transistors, and an output node provided between the third and fourth transistors. The second and third transistors are responsive to the new data bit transferred through the first transistor and the phase two clock signal, respectively, to place the phase three clock signal with the logic level corresponding to that of the new data bit at the output node. The fourth and fifth transistors are responsive to a previous data bit transferred to the subsequent stage and the phase three clock signal, respectively, for canceling the logic level of the previous data bit at the output node. This circuit structure results in a reduction in power dissipation.

References teaching a shift register with multi-phases include U.S. Pat. No. 5,260,608 issued Nov. 9, 1993 to Marbot entitled PHASE-LOCKED LOOP AND RESULTING FREQUENCY MULTIPLIER that discloses a circuit wherein a frequency multiplier is embodied by a phase-locked loop including a phase comparator for commanding a plurality of delay elements that furnish successive phase-shift signals to a logical adder made up of EXCLUSIVE OR gates, and U.S. Pat. No. 3,619,642 issued Nov. 9, 1971 to Dunn entitled MULTIPHASE BINARY SHIFT REGISTER that discloses high stability, binary data, multiphase shift register of at least three phases, stores and shifts "N" bits of binary information in binary switches, where N is the maximum number of bits capable of being stored in the shift register at all times during its operation. The binary switches are connected in series and each is then selectively connected to one of the n phases. References that disclose delay lines include U.S. Pat. No. 4,825,109 issued Apr. 25, 1989 to Reynolds entitled DIGITAL DELAY CIRCUIT that discloses a programmable digital delay circuit for controlling the firing of an electroacoustic transducer used in providing an ultrasound image of a fetus under examination, including a clock generator whose output is supplied to a delay line so as to provide a plurality of waveforms shifted in time from one another and from the wave-form generated by the clock generator. Depending on the delay desired prior to firing the transducer, one of the five waveforms may be not be inverted and thereafter used for triggering a counter whose output switches logic gates for enabling a buffer and pulse shaper to fire the transducer, and U.S. Pat. No. 3,622,809 issued Nov. 23, 1971 is Williams entitled ACTIVE DELAY LINE that discloses an electrical delay line including a series of active stages interconnected so that the leading edge of the pulses being propagated through the active stages connected in cascade controls both the turn-on and turnoff of the delayed output pulses to provide delayed pulses .having constant amplitude and constant width.

U.S. Pat. No. 4,567,386 issued Jan. 28, 1986 to Benschop and entitled INTEGRATED LOGIC CIRCUIT INCORPORATING FAST SAMPLE CONTROL discloses a MOS integrated logic circuit which comprises a plurality of groups of combinatory logic elements. These groups form a cascade in that a data output of a preceding group is directly coupled to a data input of a next group within the cascade. During successive clock pulse phases the groups of combinatory logic elements are sampled in the sequence in which they are arranged in the cascade. Charging means provide the charge to be sampled, either by means of a precharge clock phase, or by virtue of being pull-up means.

SUMMARY OF THE INVENTION

An object of the present invention is to provide an energy saving clock circuit.

Another object of the present invention is to provide an energy saving clock circuit including a substantially dissipationless shift register for providing progressive delayed timing pulses.

A still further object of the present invention is to provide an energy saving clock circuit wherein multi-phase adiabatic switching is employed in combination with a substantially dissipationless shift register.

Still another object of the present invention is to provide an energy-conserving clock power source for retractile cascading adiabatic switching circuits.

Another object of the present invention is to provide an energy conserving clock circuit including a matrix switch in combination with a substantially dissipationless shift register.

Other and further features, advantages and benefits of the invention will become apparent in the following description taken in conjunction with the following drawings. It is to be understood that the forgoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE PREFERRED EMBODIMENT

The techniques for reversible computation have been known in the art. A description of some known techniques are disclosed in the publication by C. H. Bennett, "Notes on The History of Reversible computation", IBM Journal of Research and Development, 32, page 16, (1988). In reversible computation, the energy dissipation required to erase data is avoided by saving the intermediate data until a later time when the computation, or a subset of it, can be run backwards and the data can be dissipationlessly uncomputed. Most of the proposed implementations to date have been impractical. Recently, electronic implementations have been described using adiabatic switching and "electroid switches" in the publication by J. S. Hall, "An Electroid Switching Model for Reversible Computer Architectures," Proc. Workshop on Physics and Computation, Oct. 1992 (IEEE Comp. Soc. Press, 1993, p.237).

There is a growing demand for low power, high performance electronics, especially for battery-powered applications. One possible way of addressing this demand is through the use of adiabatic switching techniques combined with the reversible computing schemes. In adiabatic switching, the voltage is the same on both sides of a switch before the switch is closed. The most readily apparent advantage of adiabatic switching techniques combined with reversible computing schemes is that the energy consumption per switching operation decreases as the duration of the switching event increases, unlike conventional CMOS circuits, in which the energy per switching event remains essentially constant. Substantially dissipationless operation is obtained if the switching is done slowly enough.

These electronic ideas can readily be implemented in CMOS by using dual-rail logic and dual bi-directional CMOS switches for the "electroid switches".

Figure 1:
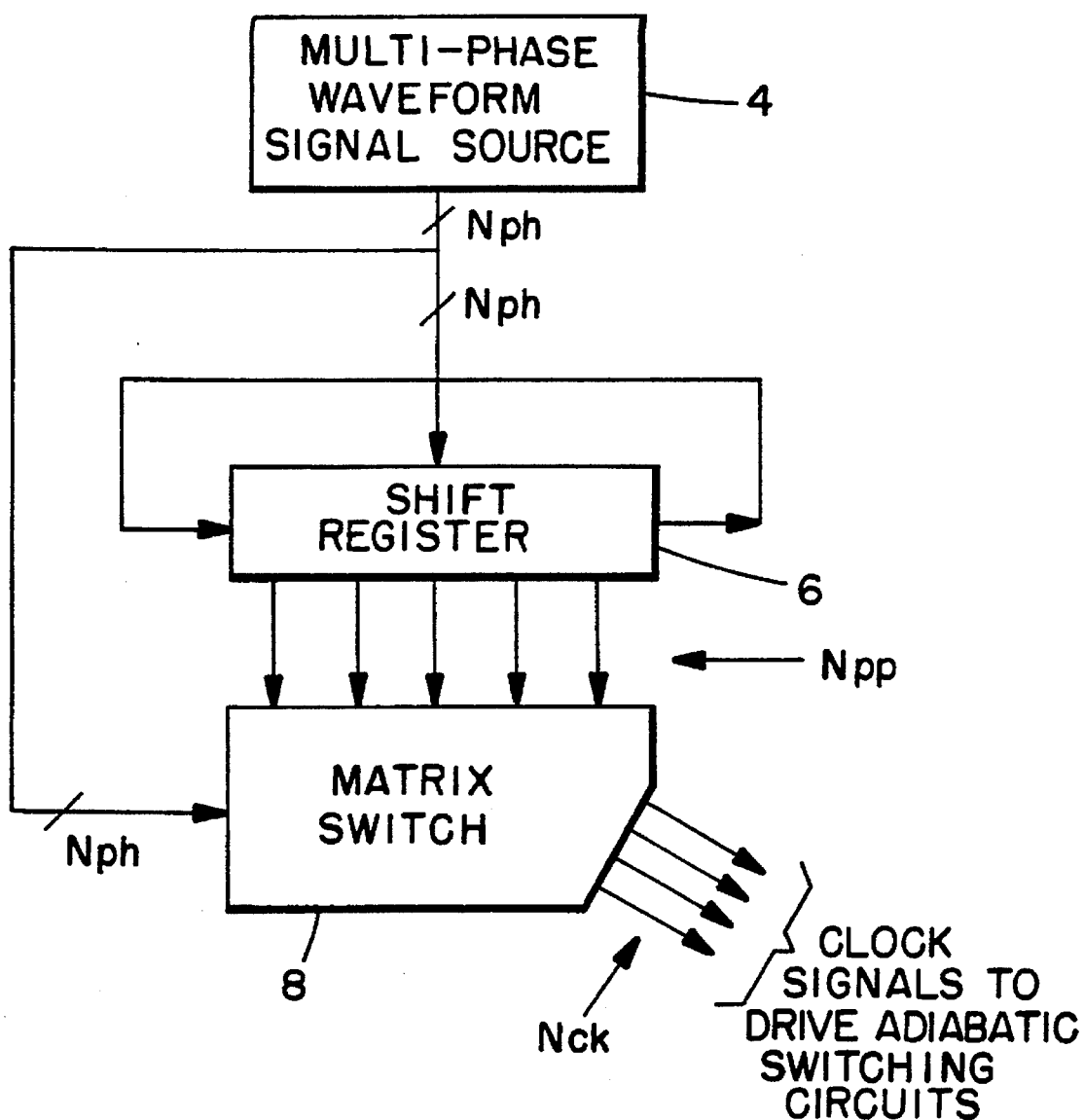
FIG. 1 is a schematic block diagram of an embodiment of an energy saving clock pulse generator circuit according to the principles of the present invention.

FIG. 1 is a schematic block diagram of an energy saving clock signal generator including a source of multi-phase waveform signals 4, a shift register 6, and a matrix switch 8. Waveform source 4 provides a number $N_{ph}$ of waveform signals to shift register 4 and matrix switch 6, where $N_{ph}$ may be four, six or more.

A number $N_{pp}$ of progressive pulses where $N_{pp}$ is an integer multiple of $N_{ph}$ are applied from shift register 6 to matrix switch 8. In the preferred embodiment using CMOS FETs there are two lines or rails for each pulse signal; a true and a complement line.

Figure 2:
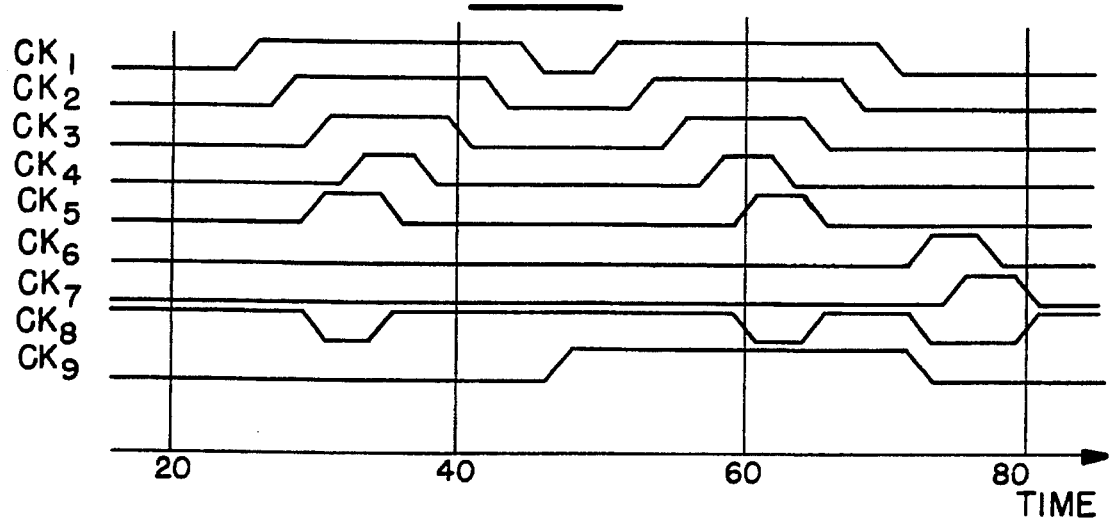
FIG. 2 is a schematic illustration of clock signal waveforms used in describing the present invention.

Matrix switch 8 responds to the $N_{ph}$ waveform signals and $N_{pp}$ progressive pulse signals to produce $N_{ck}$ clock signals, which are a number of output clock signals used to drive adiabatic logic circuits. Adiabatic switching logic requires that the charge that is put in and taken out be supplied by time varying power sources, hereinafter called clock circuits. To reduce dissipation in the entire system, the clock circuits must be energy-conserving. Furthermore, a large system needs a large number of differently timed clocks, making it impractical and inefficient to generate each of them individually by separately switched inductors. Also, switched inductor supplies do not have the highest possible efficiencies. FIG. 2, illustrates the clock signals that are required for a relatively simple, presently known circuit such as a four bit retractile adder being run reversibly.

The present invention teaches a circuit technique for providing clock signal waveforms based on the fact that the desired waveforms can be obtained by using switches to select segments from one or more simple repetitive waveforms at the desired, preselected times. An example of this is shown in FIG. 3, using sine waves as an example as shown in FIG. 4.

Figure 3:
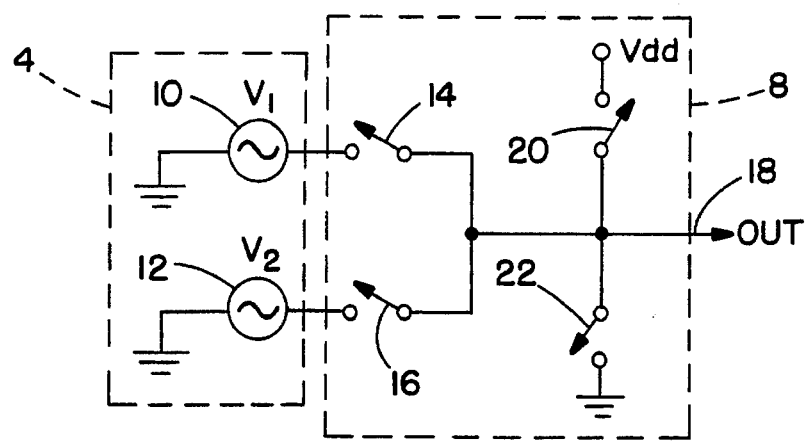
FIG. 3 is a schematic illustration of a switch circuit used in describing the present invention.

In FIG. 3 a first repetitive waveform generator, sine wave generator 10 and a second repetitive waveform generator, sine wave generator 12, which are an embodiment of the multi-phase signal source 4 of FIG. 1, are respectively connected to switches 14 and 16 which are in turn connected to an output node 18. Output node 18 is also connected to potential source Vdd through switch 20 and to ground through switch 22. Switches 14, 16, 20 and 22 are a simple embodiment of matrix switch 8 of FIG. 1. No shift register 6 is shown in FIG. 3, switches 14, 16, 20 and 22 are opened and closed by control signals at times $t_1$ through $t_5$ as follows.

Figure 4:
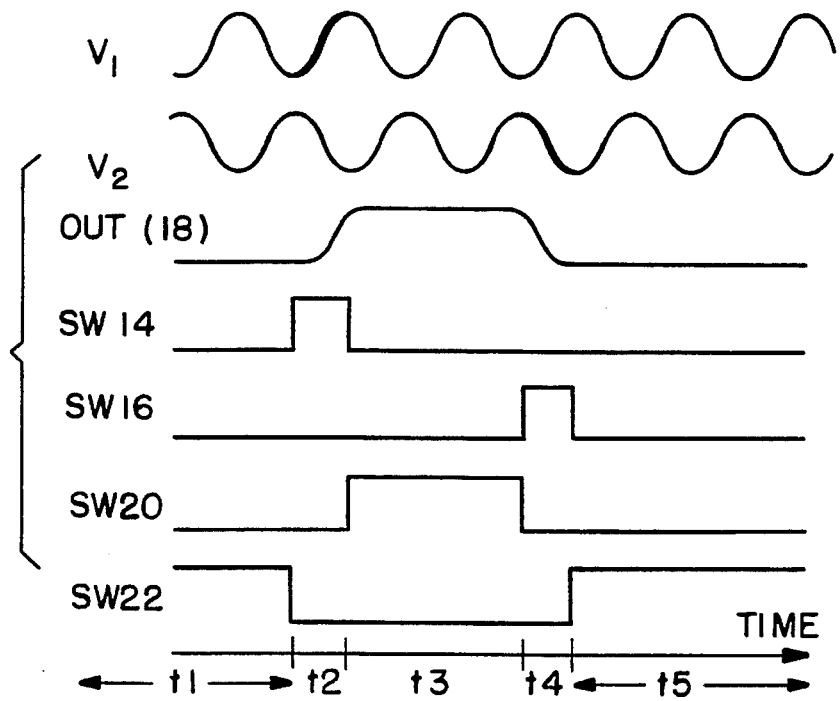
FIG. 4 is a schematic illustration of waveforms related to signals at designated points of the switch circuit of Fig. 3.

During time period $t_1$, as shown in FIG. 4, switch 22 is closed and switch 20 is open. Switches 14 and 16 are open so that the output level at node 18 is at ground. At the start of time $t_2$, switch 22 opens and switch 14 closes so that between $t_2$ and $t_3$ the rising edge from sine generator 10 signal $V_1$ goes through switch 14 and appears at output node 18.

At the start of $t_3$ switch 14 opens and switch 20 closes, connecting Vdd to node 18 to provide the flat portion of the output wave in FIG. 4. At the start of time $t_4$, switch 20 opens, disconnecting Vdd from node 18, and switch 16 closes, connecting the waveform signal $V_2$ from sine generator 12 to node 18, thereby providing the falling edge of the output waveform shown in FIG. 4.

At the start of time $t_5$, switch 16 opens and switch 22 closes to place output node 18 at ground and complete the output waveform. Thus, switch 14 is closed during time interval $t_2$ to obtain a rising edge from sine generator 10, and switch 16 is closed during time interval $t_4$ to obtain a falling edge from sine generator 12. During the other time intervals, switch 20 or 22 is closed to connect the output node 18 to the appropriate DC level of Vdd or ground. The result of this example is an output waveform illustrated in FIG. 4 that is similar to that required for $CK_9$ in FIG. 2. Conceptually there can be many input waveform signal generators and many switches, to obtain as complex an output waveform as desired.

Figure 5A:
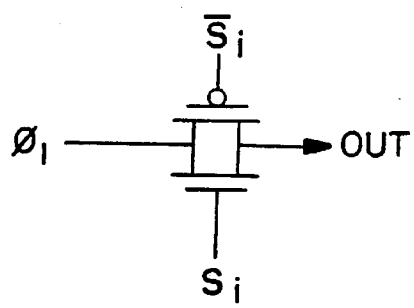
FIGS. 5A, 5B, 6A, 6B and 7A, 7B are schematic illustrations of four, four and six phase waveforms and related waveforms for switch control signals used in describing the present invention.
Figure 5B:
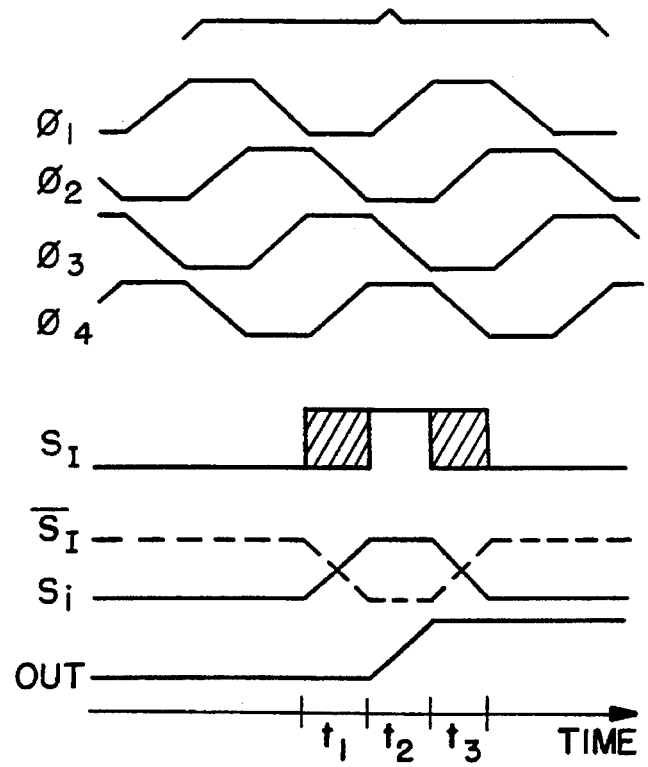

It is to be noted that the switches in FIG. 3 that are responsible for changing the state of the output can be implemented as CMOS transmission gates (an nFET and a pFET in parallel), while the state-holding switches can be implemented as single nFETs or pFETs, as appropriate. If the gate control signals applied to these switches were generated by conventional CMOS, they would look like the switch control signals shown in FIG. 4. Transmission gate operation also requires the logical complement of the signals shown. Such control signal generation, however, would be dissipative, resulting in a substantial energy overhead for the generation of the clock signals. One of the important features of the present invention is the realization that the transmission gate control signals can be generated adiabatically by single cycles of simple input clocks. Three examples of this are shown in FIGS. 5A, 5B, 6A, 6B and 7A, 7B. The precise manner in which the switch works may depend on the Vt/Vdd ratio of the FETs. In Fig. 5A a transmission gate having an input $\phi_1$, a control signal Si, and its complement $\overline{Si}$ (for CMOS technology), and an output are shown. In FIG. 5B four phases of trapezoidal input signal waveforms are illustrated as $\phi_1$, $\phi_2$, $\phi_3$ and $\phi_4$. Also, the ideal form of control signal $S_I$ is illustrated and compared with an actual control signal Si and its complement $\overline{Si}$. The cross-hatched regions of $S_I$ indicate the time periods $t_1$ and $t_3$ within which the switch control signal may be indeterminate. The actual control signals $S_i$ may be ramped up during the time period $t_1$ and ramped back down in the time period $t_3$, so that it corresponds exactly to a single cycle of one of the input waveform signals, such as $\phi_4$. Thus, the input waveform signals may be used to provide the control signal Si and its complement.

It is more practical to use sine waves for the input signals than trapezoidal waveforms, since energy-recovering sine waves can be generated by resonant circuits. When sine waves are used for the input to a transmission gate, there is no longer a flat portion of the waveform, as there is for trapezoidal waveforms, and therefore, there is not a long period of time when the ideal control signal $S_I$ may be indeterminate. Instead, the transmission gate must switch on or off at a specific time, when the input signal is at its maximum or minimum, if energy dissipation is to be minimized. However, since the sine wave is slowly varying at its maximum and its minimum, the timing is not excessively critical, and can be somewhat incorrect without substantially increasing the dissipation. The timing of the transmission gates is accomplished by bringing the gate control signal of the appropriate FET through its threshold voltage $V_T$ at the desired instant.

Figure 6A:
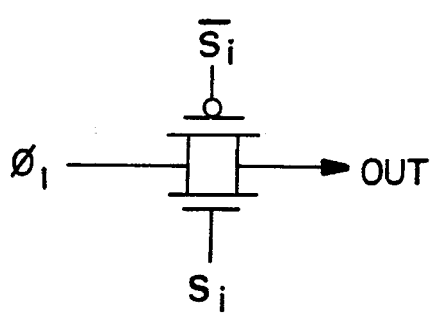
Figure 6B:
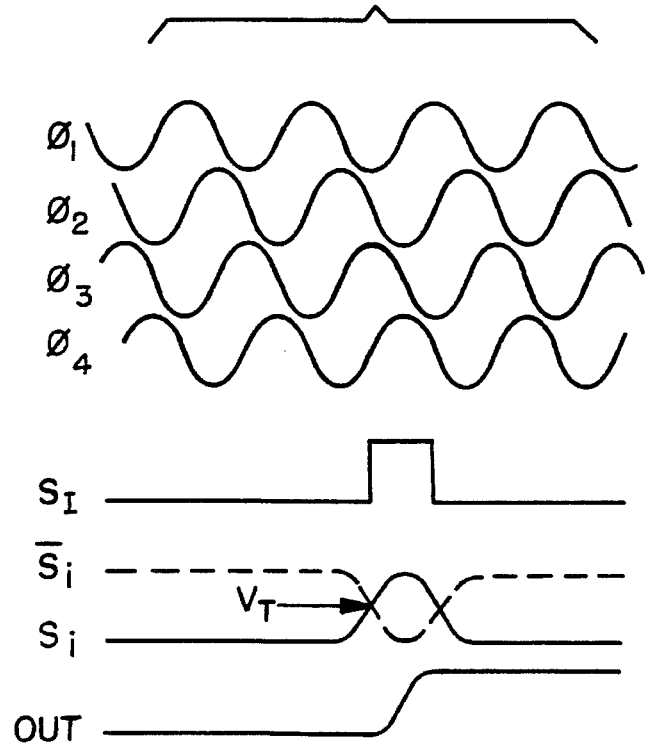
Figure 7A:
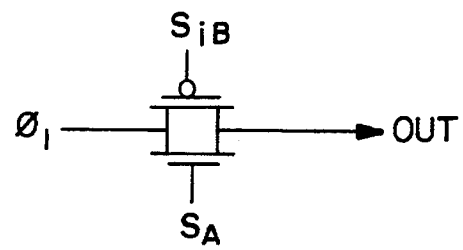
Figure 7B:
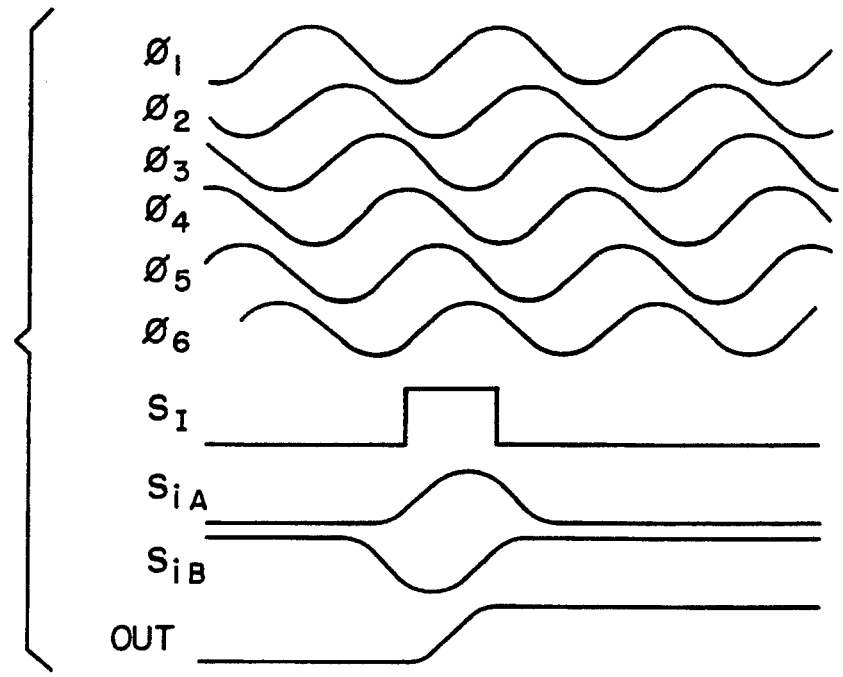

In FIGS. 6A and 6B an embodiment of a four phase case is illustrated in which sine wave input waveforms are employed. This embodiment requires that the $V_T/Vdd$ ratio be approximately 0.5. The six phase sine input case of FIG. 7A, 7B is perhaps the most important, since resonant circuits cannot generate the waveforms shown in FIG. 5B, and in the four phase system of FIG. 6B the switch passes through a high resistance state in the center of the swing as the nFET turns off and the pFET turns on. In the six phase case, $V_T/Vdd=¼$ (approximately) and to select a rising edge of $\phi_1$, a single cycle of $\phi_6$ is used for the gate of the nFET, while a single cycle of $\phi_2$ is used for the gate of the pFET.

To generate a complex set of output waveforms, single cycles must be available to provide the desired switching signals for switching the output at almost every possible rising or falling edge of the simple periodic input waveforms such as provided by generators 10 and 12. The best way to provide this is to create a switching pulse for every possible rising or falling edge that may be desired. This is illustrated in FIG. 8 for four phase trapezoidal clocks.

Figure 8:
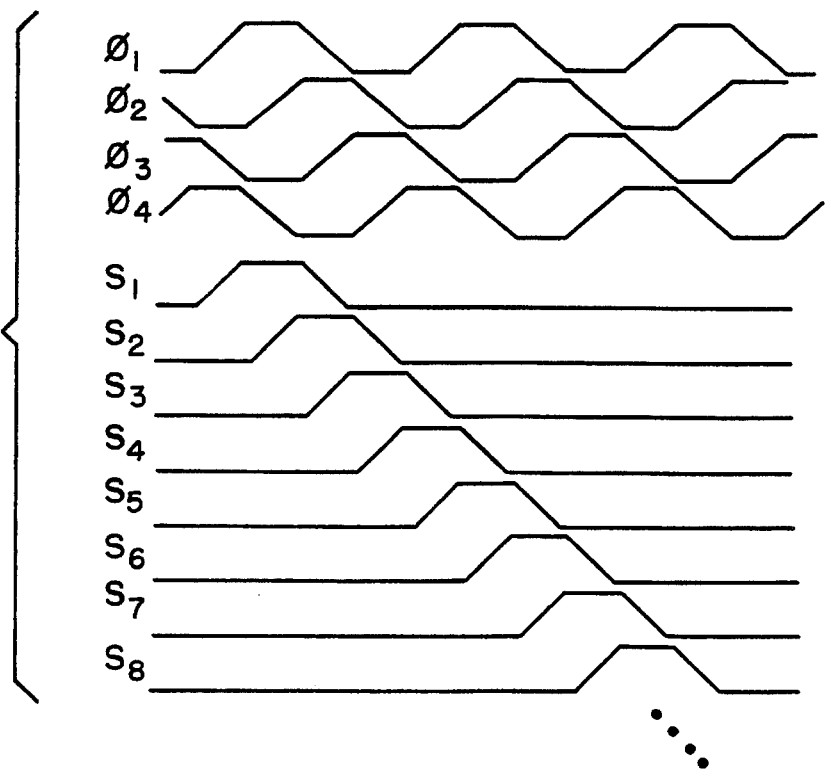
FIG. 8 is a schematic illustration of waveforms of single cycle control signals for a switch circuit.
Figure 9:
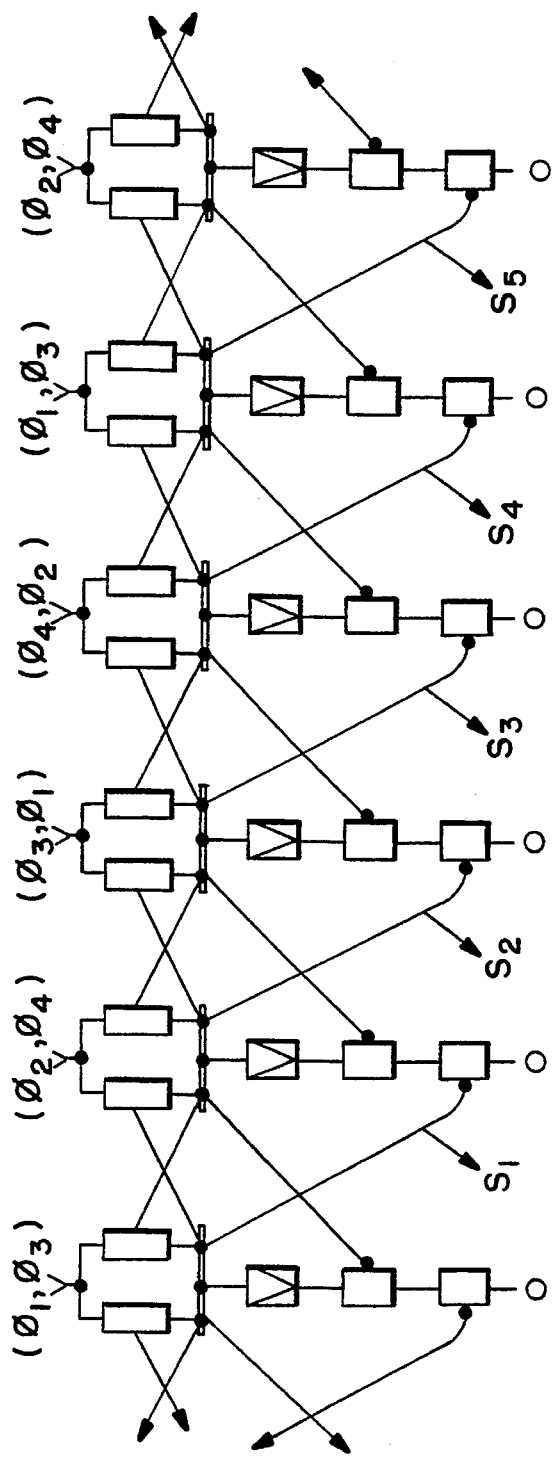
FIGS. 9, 10 and 11 are three schematic circuit illustrations of three embodiments of adiabatic switching chains used in describing the present invention.
Figure 11:
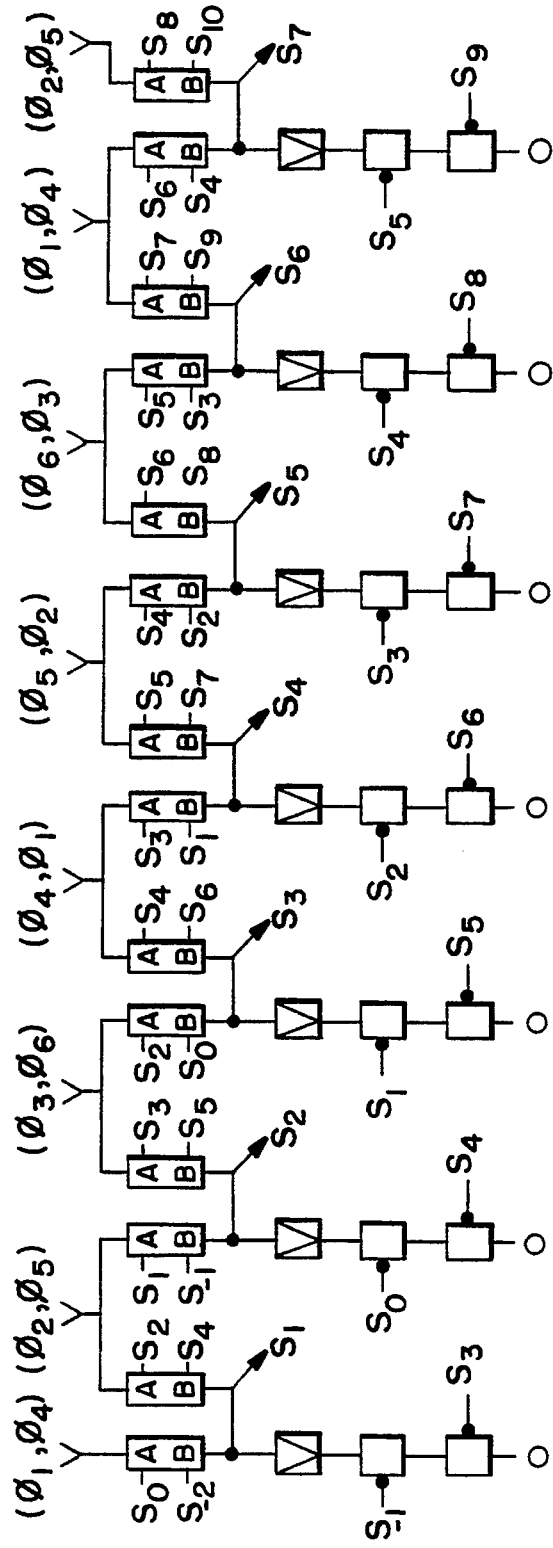
Figure 10:
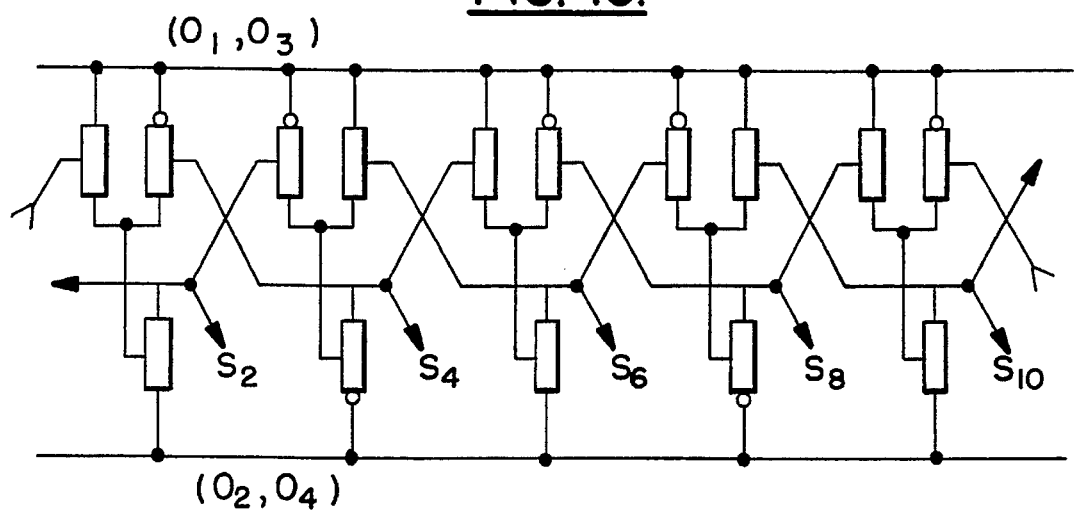

FIG. 8 shows a marching series of single cycles ($S_1$, $S_2$, $S_3$... $S_8$ obtained from four phase waveforms $\phi_1$, $\phi_2$, $\phi_3$ and $\phi_4$. A circuit means to provide the waveforms of FIG. 8 includes a chain of energy conserving adiabatic switching logic, indicated by shift register 6 in FIG. 1, in which the stages work together so as to progressively switch each stage in the chain, just once. Adiabatic switching circuitry is effective and efficient for this purpose, and there are a number of embodiments in which it can be carried off. FIGS. 9, 10 and 11 show three examples of circuits that can serve as embodiments of shift register 6 of FIG. 1. FIG. 9 is for four phase trapezoidal inputs $\phi_1$, $\phi_2$, $\phi_3$ and $\phi_4$ illustrated in FIG. 8 and generates the waveforms $s_1$ through $s_8$ also shown in FIG. 8. If instead, sine waves are used for $\phi_1$, $\phi_2$, $\phi_3$ and $\phi_4$ then Vt/Vdd=0.5 would be required. An alternative type of four phase chain is shown in FIG. 10, which is a generalization of the divide-by-two frequency counter. FIG. 11 is for six phase sine waves $\phi_1$, $\phi_2$, $\phi_3$, $\phi_4$, $\phi_5$ and $\phi_6$ and Vt/Vdd =0.25.

The circuit in FIG. 10 is shown in the dynamic form for simplicity, but can be easily made static. The technique for the triggering and termination of the chain are not important to this disclosure, but it should be noted that one possibility is to connect the end back to the beginning, so as to create a ring which repetitively generates the desired output waveforms. It should be noted that the circuits of FIGS. 9, 10 and 11 are dual rail circuits wherein each line represents a pair of signal wires. The specific details of the operation of the stages of the circuits of FIGS. 9, 10 and 11 can be understood by one skilled in the art. The six phase embodiment of FIG. 11 is the preferred embodiment for the same reasons given above. The output pulses of this chain are similar to the control signals shown in FIG. 7B except that each pulse has a flat top for ⅙th of a cycle. The operation of the chain of FIG. 11 can be seen by considering $s_4$. The 'true' side of $s_4$ rises with one of the rising edges of $\phi_4$, and then falls with the next falling edge of $\phi_5$. The transmission gate connection of $s_4$ to $\phi_4$ is gated by the preceding pulse signals $s_3$ and $s_1$, which lead the rising edge ⅙th and ⅜ths of a cycle, respectively, as required for these flat-topped signals. The transmission gate connection of $s_4$ to $\phi_5$ is gated by the following pulse signals $s_5$ and $s_7$, which lead the falling edge by ⅜th and ⅙ths of a cycle, respectively, again as required. After the pulses have passed by, $s_1$, $s_3$, $s_5$, and $s_7$ are all low, and $s_4$ will undergo no further state changes until the chain is triggered again. The flat-topped character of the pulses allows the single signal $s_2$ to deactivate the latching behavior of the floating latch during the rising edge of $s_4$, and the single signal $s_6$ to continue the deactivation during the falling edge. The same process outlined above happens progressively at each stage of the chain.

Figure 12A:
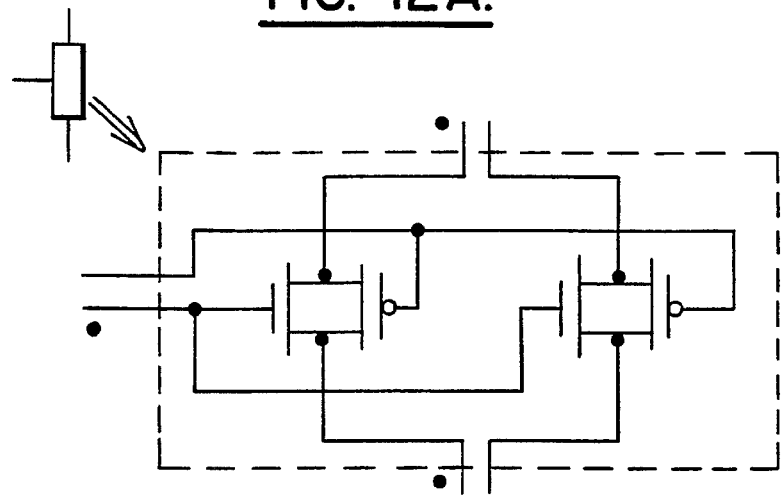
FIGS. 12A, 12B and 12C are schematic illustrations of a single control electroid switch, a double control electroid switch and a floating latch used in the circuit of FIGS. 9–11 and 13–15.
Figure 12B:
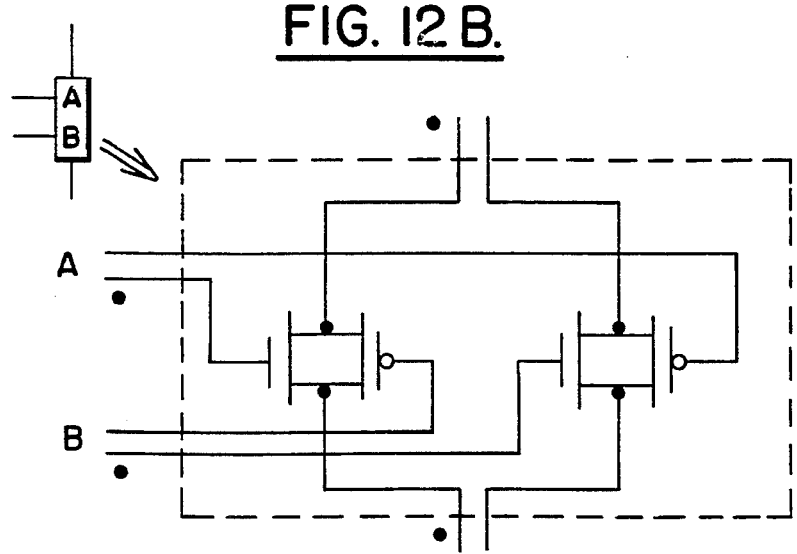
Figure 12C:
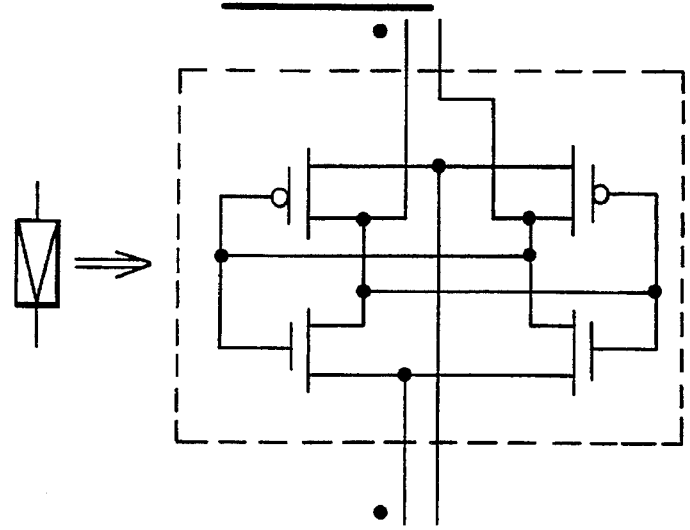
Figure 13:
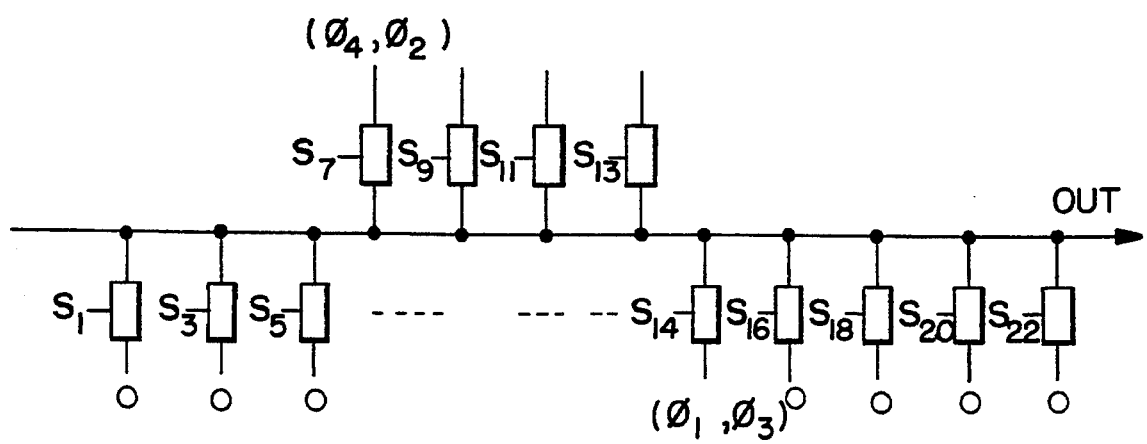
FIGS. 13, 14 and 15 are schematic illustrations of circuit diagrams of three embodiments of matrix switching and latching circuits used in describing the present invention.
Figure 14:
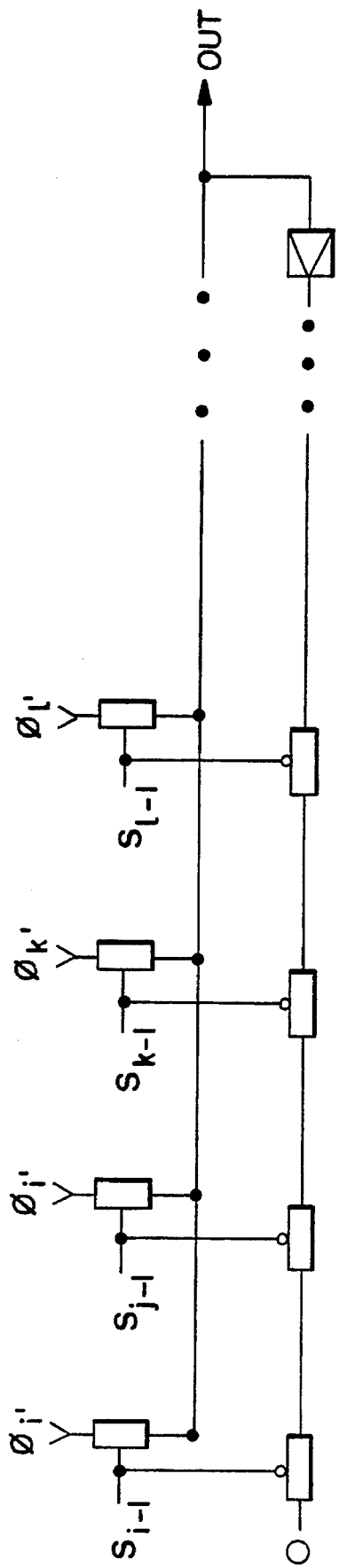
Figure 15:
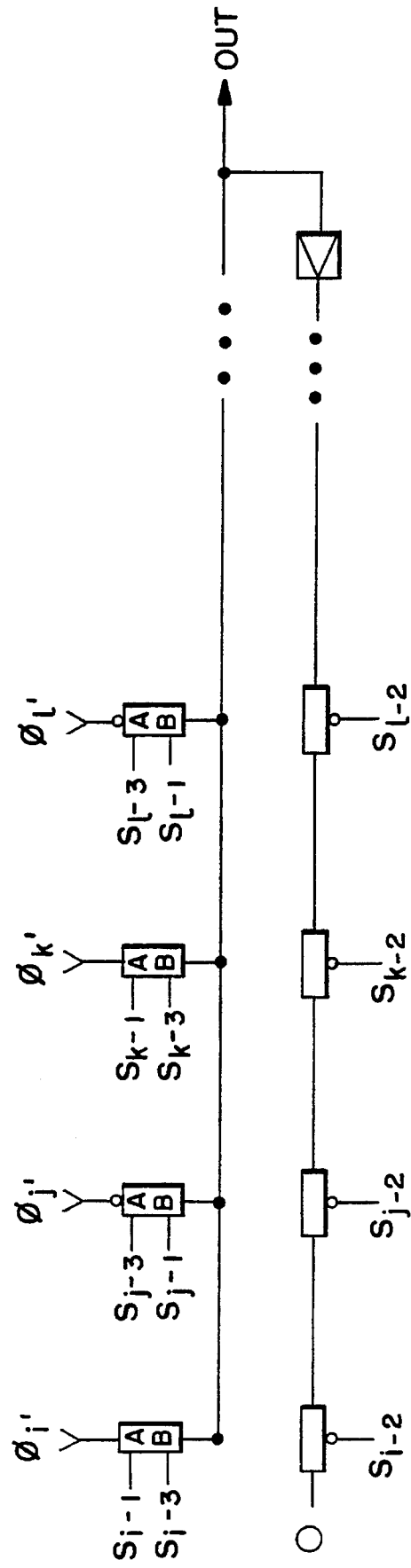

FIG. 12A is a more detailed schematic illustration of a single control electroid switch used in the embodiments of FIGS. 9, 10 and 11 as well as FIGS. 13, 14 and 15 discussed herein below. Likewise, FIG. 12B is a schematic illustration of a double control electroid switch, and FIG. 12C is a schematic illustration of a floating latch circuit used in the various embodiments.

The preceding disclosure described how shift register 6 can be used to generate a marching series of single pulses. The technique for obtaining an output waveform with a transition at any desired time is to use the appropriate single pulse(s) to activate a transmission gate between input waveform and output at the desired time. Finally, for the technique for latching there are three possibilities. In case one, no latching is used. The outputs are simply left floating between transitions. In this case, the above disclosure is complete. The case one solution may not be satisfactory, however, if other signals are capacitively coupled to the output in question during its quiescent state, since such signals will cause the output to drift. In case two, many switches to DC can be used, and as many of the single cycle waveforms as necessary to cover the time between switching transitions. This is illustrated in FIG. 13. It should be noted that other derived outputs might also be usable to control the latching FETs. In case three, the simplest approach uses a floating latch element as shown in FIGS. 14 and 15. In the embodiment of FIG. 14 the same single cycle signals that are used to enable the transmission gates are also used to cut off the holding effect of the floating latch. In the embodiment of FIG. 14, flat-topped signals as in FIG. 11 are assumed, and the second preceding signal is used to deactivate the latching for each transition.

What has been described is a clock circuit consisting of a progressive pulse chain powered by a set of simple repetitive clock signals, the stage-by-stage outputs of which control sets of switches and latches that select the desired segments of the simple repetitive clocks for output as timed logic-controlling clock signals.

This invention is very significant in that it enables the use of retractile cascade adiabatic switching logic. Such logic is straightforward to build and use, but until now it has lacked a suitable supply scheme.

While preferred embodiments of the invention have been disclosed in detail, it should be understood by those skilled in the art that various other modifications may be made to the illustrated embodiment without departing from the scope of the invention as described in the specification and defined in the appended claims.

What is claimed is:

1. A circuit for generating a clock signal comprising:

a waveform generator for generating first through $n^{th}$ phase waveform signals;

a shift register connected to said waveform generator having a plurality of stages and respective outputs therefrom;

a switching matrix having an output terminal;

said switching matrix having first through m switches having a first side coupled to said output terminal;

said first switch having a second side coupled to one of said first through n phase waveform signals;

a second switch of said m switches having a second side coupled to a first voltage terminal on a first dc power supply, a third switch of said m switches having a second side coupled to a second voltage terminal on said first dc power supply, said first through third switches each having a control input coupled to selected outputs of said stages of said shift register.

2. The circuit of claim 1 wherein said clock generator generates an n phase waveform where n is greater than or equal to 4.

3. The circuit of claim 1 wherein each of said first through third switches include a field effect transistor.

4. The circuit of claim 1 wherein said switch matrix further includes a fourth switch coupled in series between said second switch and said first voltage terminal.

5. The circuit of claim 4 wherein the control input of said fourth switch is coupled to a selected output of one of said stages of said shift register.

6. The circuit of claim 1 wherein one of said first through third switches include a plurality of switches coupled in series.

7. A circuit for generating at least one sequence of output clock pulses formed from a composite of selected portions of at least one source of repetitive signals comprising:

at least one source of repetitive signals;

an output terminal;

a first switching means connected between said at least one source of repetitive signals and said output terminal, said first switching means functioning to connect first selected portions of said repetitive signals of said at least one source to said output terminal;

a second switching means connected between said at least one source of repetitive signals and said output terminals, said second switching means functioning to connect second selected portions of said repetitive signals of said at least one source to said output terminal;

and means for producing a plurality of timing signals connected to said first and second switching means to operate said switching means to connect said first and second selected portions of said repetitive signals from at least one source to said output terminal to provide at least one sequence of output clock signals formed from said selected portions of said at least one source of repetitive signals.

8. A circuit for generating at least one sequence of output clock pulses according to claim 7 including a plurality of sources of repetitive signals;

a switching means connected between selected ones of said sources of repetitive signals and said output terminal, said switching means functioning to connect selected portions of said repetitive signals of said plurality of sources to said output terminal;

and shift register means for producing a plurality of timing signals connected to said switching means to operate said switching means to connect said selected portions of said repetitive signals from said plurality of sources to said output terminal to provide at least one sequence of output clock signals formed from said selected portions of said sources of repetitive signals.

9. A circuit according to claim 8 wherein said plurality of sources of repetitive signals produce a plurality of substantially identical repetitive signals that are phase shifted in time relative to each other.

10. A circuit according to claim 8 wherein said plurality of sources of repetitive signals are energy-recovering sources.

11. A circuit according to claim 8 wherein said switching means includes switches that are operated adiabatically by control signals timed to open and close said switches when the voltage across said switches is substantially zero.

12. A circuit according to claim 8 wherein said shift register operates adiabatically.

13. A circuit according to claim 8 further including a source of DC voltage, and wherein said switching means operate to selectively connect said DC voltage source to said output terminal.

14. A circuit according to claim 13 wherein said switching means selectively connects selected portions of said repetitive signals and said DC voltage source to said output terminal to provide an output signal composed of said selected portions of said repetitive signals and DC voltage.

* * * * *